US012402373B2

(12) United States Patent
Zhu

(10) Patent No.: US 12,402,373 B2
(45) Date of Patent: Aug. 26, 2025

(54) SEMICONDUCTOR APPARATUS WITH ISOLATION PORTION BETWEEN VERTICALLY ADJACENT ELEMENTS, AND ELECTRONIC DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NJ (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 446 days.

(21) Appl. No.: 17/731,844

(22) Filed: Apr. 28, 2022

(65) Prior Publication Data

US 2022/0352310 A1  Nov. 3, 2022

(30) Foreign Application Priority Data

Apr. 29, 2021 (CN) .......................... 202110477558.9

(51) Int. Cl.
*H10D 62/10* (2025.01)
*H10D 62/13* (2025.01)
*H10D 62/17* (2025.01)

(52) U.S. Cl.
CPC ......... *H10D 62/116* (2025.01); *H10D 62/151* (2025.01); *H10D 62/235* (2025.01)

(58) Field of Classification Search
CPC ........... H01L 29/66734; H01L 21/1761; H01L 21/8221; H01L 21/823481;
(Continued)

(56) References Cited

U.S. PATENT DOCUMENTS 6,174,763 B1 * 1/2001 Beilstein, Jr. ...... H10D 30/6728
257/E27.099
2001/0006248 A1 * 7/2001 Allen .................... B81B 3/0086
257/544
(Continued)

OTHER PUBLICATIONS

P, Upadhyay, R. Mehra and N. Thakur, "Low power design of an SRAM cell for portable devices," 2010 International Conference on Computer and Communication Technology (ICCCT), Allahabad, India, 2010, pp. 255-259 (Year: 2010).*

*Primary Examiner* — Julio J Maldonado
*Assistant Examiner* — Paul A Berry
(74) *Attorney, Agent, or Firm* — Christopher R. Christenson; Kelly, Holt & Christenson, P.L.L.C.

(57) ABSTRACT

A semiconductor apparatus with an isolation portion between vertically adjacent elements and an electronic device including the semiconductor apparatus are provided. The semiconductor apparatus may include: a substrate; a first vertical semiconductor element and a second vertical semiconductor element stacked on the substrate sequentially, each of the first vertical semiconductor element and the second vertical semiconductor element including a first source/drain region, a channel region and a second source/drain region stacked sequentially in a vertical direction; and an isolation structure configured to electrically isolate the first vertical semiconductor element from the second vertical semiconductor element, and the isolation structure including a pn junction.

18 Claims, 8 Drawing Sheets

(58) Field of Classification Search
CPC ......... H01L 21/823878; H01L 27/0617; H01L 27/0688; H01L 27/0705; H01L 29/0653; H01L 29/0847; H01L 29/1033; H01L 29/66666; H01L 29/66712; H01L 29/7827; H01L 29/783; H01L 29/7834; H01L 29/78642; H01L 29/808; H01L 2924/13091; H01L 33/0016; H01L 21/761; H10D 88/00; H10D 30/66; H10D 30/0291; H10D 84/0151; H10D 8/80; H10D 30/63; H10D 30/025; H10D 84/016; H10D 84/83; H10D 84/856; H10D 62/114
See application file for complete search history.

(56) References Cited

U.S. PATENT DOCUMENTS

| | | | |
|---|---|---|---|
| 2010/0171188 A1* | 7/2010 | Lung | H01L 21/743 |
| | | | 438/682 |
| 2011/0012085 A1* | 1/2011 | Deligianni | H01L 29/78642 |
| | | | 257/E21.409 |
| 2018/0108577 A1* | 4/2018 | Zhu | H10D 84/0184 |
| 2019/0221638 A1* | 7/2019 | Reznicek | H01L 29/66439 |
| 2020/0328206 A1* | 10/2020 | Zhang | H10D 30/63 |

* cited by examiner

SEMICONDUCTOR APPARATUS WITH ISOLATION PORTION BETWEEN VERTICALLY ADJACENT ELEMENTS, AND ELECTRONIC DEVICE

CROSS REFERENCE TO RELATED APPLICATION(S)

This application claims priority to Chinese Patent Application No. 202110477558.9, filed on Apr. 29, 2021, the entire contents of which are incorporated herein in their entireties by reference.

TECHNICAL FIELD

The present disclosure relates to a field of semiconductor, and in particular to a semiconductor apparatus with an isolation portion between vertically adjacent elements and an electronic device including the semiconductor apparatus.

BACKGROUND

In a horizontal element such as a metal oxide semiconductor field effect transistor (MOSFET), a source, a gate and a drain are arranged in a direction substantially parallel to a surface of a substrate. Due to such arrangement, it is difficult to further downsize the horizontal element. In contrast, in a vertical element, the source, the gate and the drain are arranged in a direction substantially perpendicular to the surface of the substrate. Therefore, the vertical element may be easier downsized than the horizontal element. An integration density can be increased by stacking the vertical elements on each other. Especially in a case that an active region includes a single crystal, there is currently no effective method to achieve electrical isolation between the stacked vertical elements, other than a bonding process.

SUMMARY

In view of this, an object of the present disclosure is, at least in part, to provide a semiconductor apparatus with an isolation portion between vertically adjacent elements, and an electronic device including the semiconductor apparatus.

According to an aspect of the present disclosure, a semiconductor apparatus is provided, including: a substrate; a first vertical semiconductor element and a second vertical semiconductor element stacked on the substrate sequentially, each of the first vertical semiconductor element and the second vertical semiconductor element including a first source/drain region, a channel region and a second source/drain region stacked sequentially in a vertical direction; and an isolation structure configured to electrically isolate the first vertical semiconductor element from the second vertical semiconductor element, and the isolation structure including a pn junction.

According to another aspect of the present disclosure, an electronic device is provided, including the semiconductor apparatus described above.

BRIEF DESCRIPTION OF THE DRAWINGS

The above and other objects, features and advantages of the present disclosure will become more apparent through the following description of embodiments of the present disclosure with reference to the accompanying drawings, in which.

Throughout the accompanying drawings, the same or similar reference signs refer to the same or similar parts.

DETAILED DESCRIPTION OF EMBODIMENTS

Figure 1:
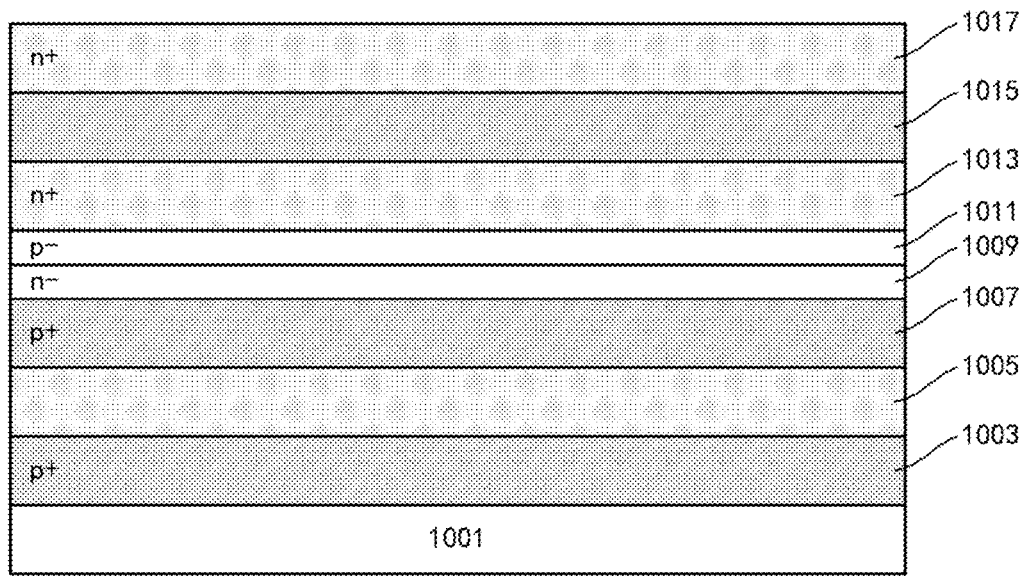
FIG. 1 and FIG. 2 show schematic diagrams of some stages in a process of manufacturing a semiconductor apparatus according to an embodiment of the present disclosure.

Hereinafter, the embodiments of the present disclosure will be described with reference to the accompanying drawings. It should be understood that these descriptions are merely exemplary and are not intended to limit the scope of the present disclosure. Also, in the following description, descriptions of well-known structures and techniques are omitted to avoid unnecessarily obscuring the concepts of the present disclosure.

Various schematic structural diagrams according to the embodiments of the present disclosure are shown in the accompanying drawings. The figures are not drawn to scale. Some details are enlarged and some details may be omitted for clarity of presentation. The shapes of the various regions and layers as well as the relative size and positional relationship thereof shown in the figures are only exemplary. In practice, there may be deviations due to manufacturing tolerances or technical limitations, and those skilled in the art may additionally design regions/layers with different shapes, sizes and relative positions according to actual desires.

In the context of the present disclosure, when a layer/element is referred to as being located "on" another layer/element, the layer/element may be located directly on the another layer/element, or there may be an intermediate layer/element between them. In addition, if a layer/element is located "on" another layer/element in one orientation, the layer/element may be located "under" the another layer/element when the orientation is reversed.

According to the embodiments of the present disclosure, the semiconductor apparatus including the vertical semiconductor elements stacked on each other is provided. The vertical semiconductor element includes an active region extending vertically with respect to the substrate (e.g., substantially perpendicular to a surface of a substrate), and the active region includes: source/drain regions at an upper end and a lower end of the active region, and a channel region between the source/drain regions. For example, the active region may include a first source/drain layer, a channel layer and a second source/drain layer sequentially stacked on the substrate. Various layers may be adjacent to each other, or another semiconductor layer (which has a larger or smaller band gap than an adjacent layer), such as a leakage suppression layer and/or an on-state current enhancement layer, may also exist among the various layers. The source/drain regions of the element may be formed in the first source/drain layer and the second source/drain layer, and the channel region of the element may be formed in the channel layer. These layers may be formed by epitaxial growth and may include a single crystal.

An isolation structure based on the pn junction may be provided between adjacent elements in a vertical direction. As the pn junction may be formed through the semiconductor layer, a formation of the isolation structure may be compatible with the fabrication of the element. For example, the semiconductor layer may be epitaxially grown between active regions of the adjacent elements. In this way, a crystal quality of the active region of the element may not be affected.

Such the pn junction may be part of an npn junction or a pnp junction. The pn junction-based isolation structure may be formed by a semiconductor layer additionally disposed between adjacent elements, or may also include at least one source/drain layer.

The present disclosure may be presented in various forms, some examples of which will be described below. In the following description, a selection of various materials is involved. For the selection of materials, in addition to functions of the materials (for example, a semiconductor material may be used to form the active region, a dielectric material may be used to form an electrical isolation, and a conductive material may be used to form an electrode, an interconnection structure, etc.), an etching selectivity is also considered. In the following description, a required etching selectivity may or may not be indicated. It should be clear to those skilled in the art that when etching a material layer is mentioned below, if it is not mentioned or shown that other layers are also etched, then the etching may be selective, and the material layer may have an etching selectivity relative to other layers exposed to the same etching formula.

Figure 2:
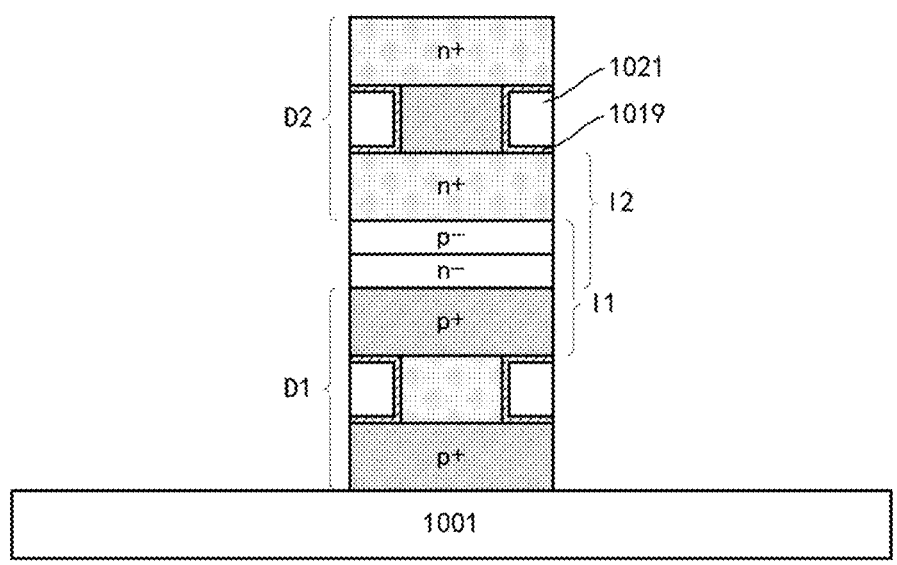

FIG. 1 and FIG. 2 show schematic diagrams of some stages in a process of manufacturing a semiconductor apparatus according to the embodiments of the present disclosure.

As shown in FIG. 1, a substrate 1001 is provided. The substrate 1001 may be various forms of substrates, including but not limited to a bulk semiconductor material substrate such as a bulk Si substrate, a semiconductor-on-insulator (SOI) substrate, a compound semiconductor substrate such as a SiGe substrate, etc. In the following description, for convenience of explanation, the bulk Si substrate such as a Si wafer is used as an example.

A semiconductor layer for defining an active region of a first vertical semiconductor element (see D1 shown in FIG. 2, hereinafter referred to as a first element), a semiconductor layer for defining an active region of a second vertical semiconductor element (see D2 shown in FIG. 2, hereinafter referred to as a second element), and a semiconductor layer for defining an isolation portion (see I1 and I2 shown in FIG. 2) between the active region of the first vertical semiconductor element and the active region of the second vertical semiconductor element, may be formed by, for example, epitaxial growth on the substrate 1001. For example, the semiconductor layer for defining the active region of the first element D1 may include a first source/drain layer 1003, a channel layer 1005 and a second source/drain layer 1007. Similarly, the semiconductor layer for defining the active region of the second element D2 may include a first source/drain layer 1013, a channel layer 1015 and a second source/drain layer 1017. The semiconductor layer for defining the isolation portion may include a first semiconductor layer 1009 and a second semiconductor layer 1011. These semiconductor layers may have good crystal quality and may be of a single crystal structure, and adjacent semiconductor layers may have a clear crystal interface therebetween.

These semiconductor layers may include various suitable semiconductor materials, for example, an elemental semiconductor material such as a Group IV elemental semiconductor material (e.g. Si or Ge), a compound semiconductor material such as a Group IV compound semiconductor material (e.g. SiGe), or a Group III-V compound semiconductor material (e.g. InP or GaAs). A material of the semiconductor layer may be selected based on factors such as the properties of the substrate and the element performance to be achieved, etc.

In this embodiment, various semiconductor layers formed on the Si wafer may include a Si-based material. For example, the channel layers 1005 and 1015 may include SiGe (which is used for providing etch selectivity to form a self-aligned gate stack), other semiconductor layers may include Si. However, the present disclosure is not limited thereto. For example, the channel layers 1005 and 1015 may also include the same material as the other semiconductor layers.

Various semiconductor layers used to form the active region may be appropriately doped according to a conductivity type of the element to be formed. For example, the source/drain layer may be doped to have the same conductivity type as the element to be formed, while the channel layer may not be intentionally doped, or lightly doped to have a conductivity type opposite to the conductivity type of the element to be formed, so as to adjust a threshold voltage of the element. In this embodiment, the first element D1 may have a first conductivity type such as p-type, and the first source/drain layer 1003 and the second source/drain layer 1007 may be heavily p-type doped, and the channel layer 1005 may not be intentionally doped or may be lightly n-type doped. Similarly, the second element D2 may have a second conductivity type such as n-type, and the first source/drain layer 1013 and the second source/drain layer 1017 may be heavily n-type doped, and the channel layer 1015 may not be intentionally doped or may be lightly p-type doped. The doping of the semiconductor layer may be achieved by in-situ doping during epitaxial growth, or may be achieved by other doping methods such as an ion implantation.

Additionally, the semiconductor layer for defining the isolation portion may be appropriately doped according to the conductivity types of the elements on opposite sides of the semiconductor layer, so as to provide a pn junction. For example, the first semiconductor layer 1009 may be lightly n-type doped, and the second semiconductor layer 1011 may be lightly p-type doped. A doping concentration for at least one of the first semiconductor layer 1009 or the second semiconductor layer 1011 may be less than about $2\times10^{19}$ $cm^{-3}$.

Adjacent semiconductor layers may have a doping concentration interface therebetween.

Various semiconductor layers may have a suitable thickness. For example, the source/drain layers 1003, 1007, 1013 and 1017 may have a thickness in a range of about 10 nm to 50 nm; the channel layers 1005 and 1015 may have a thickness in a range of about 10 nm to 100 nm; the first semiconductor layer 1009 and the second semiconductor layer 1011 may have a thickness in a range of about 15 nm to 50 nm. The first element D1 and the second element D2 may have different dimensions, for example, they may have different channel layer thicknesses (to achieve different gate lengths) to achieve different electrical characteristics.

The active region of the element may be patterned from the semiconductor layers described above. For example, as shown in FIG. 2, the above-described stack of semiconductor layers may be patterned into a vertically extending column (e.g., a cylinder) by photolithography. This patterning may be performed by using a hard mask layer (not shown in FIG. 2) on the top. Corresponding sidewalls of various semiconductor layers may be substantially coplanar with each other in the vertical direction.

The channel layer (here, SiGe) may be recessed laterally with respect to the upper and lower source/drain layers (here, Si) by, e.g., selective etching. In order to better control an etching depth, for example, atomic layer etching (ALE) can be used. A gate dielectric layer 1019 and a gate conductor layer 1021 may be formed by, for example, depositing a gate dielectric material and a gate conductor material, and etching back. The formed gate stack (1019/1021) can be embedded into the recess of the channel layer with respect to the source/drain layers and be self-aligned to the channel layer. For example, the gate dielectric layer 1019 may include a high-k gate dielectric, such as $HfO_2$, with a thickness in a range of about 1 nm to 5 nm, and the gate conductor layer 1021 may include a metal.

In this example, the first element D1 and the second element D2 include a same gate stack configuration. However, the present disclosure is not limited thereto. The first element D1 and the second element D2 may include different gate stack configurations, especially when their conductivity types are different.

For example, a sacrificial gate may be formed in the recesses of the channel layers 1005 and 1015 with respect to the source/drain layers. A dielectric layer with a certain thickness may be formed on the substrate 1001, and a top surface of the dielectric layer may be at a height of the gate stack of the first element D1 to be formed. For example, the top surface of the dielectric layer is at a height between a height of a top surface and a height of a bottom surface of the channel layer 1005 of the first element D1, so as to reduce an overlap of the gate stack and the source/drain layers. Then, the sacrificial gate may be removed to free up a recessed space, and a formation of a first gate stack that is suitable for the first element D1 is performed on the dielectric layer. The formed first gate stack is embedded into the recess. The height of the dielectric layer may be increased by further deposition such that its top surface is at a height of the gate stack of the second element D2 to be formed. For example, the top surface of the dielectric layer is at a height between a height of a top surface and a height of a bottom surface of the channel layer 1015 of the second element D2, so as to reduce an overlap of the gate stack and the source/drain layers. Then, the first gate stack formed in the recess of the channel layer 1015 of the second element D2 with respect to the source/drain layers may be removed, and a formation of a second gate stack that is suitable for the second element D2 is performed on the dielectric layer. The formed second gate stack may be embedded into the recess of the channel layer 1015 of the second element D2 with respect to the source/drain layers.

The example in which two elements D1 and D2 are stacked on each other is illustrated. However, the present disclosure is not limited thereto. For example, more elements may be stacked vertically, and the isolation portion may be provided between adjacent elements as desired.

As shown in FIG. 2, the semiconductor apparatus according to the present embodiment may include the first element D1 and the second element D2 stacked on each other. The first element D1 may include a first source/drain region formed in the first source/drain layer 1003, a second source/drain region formed in the second source/drain layer 1007, and a channel region formed in the channel layer 1005. The second element D2 may include a first source/drain region formed in the first source/drain layer 1013, a second source/drain region formed in the second source/drain layer 1017, and a channel region formed in the channel layer 1015. The channel region is between the first source/drain region and the second source/drain region. The gate stack (1019/1021) may surround peripheries of the channel layers 1005 and 1015.

Isolation structures I1 and I2 may be provided between the first element D1 and the second element D2. The isolation structure I1 includes the second source/drain layer 1007 of the first element D1, the first semiconductor layer 1009, and the second semiconductor layer 1011. The second source/drain layer 1007, the first semiconductor layer 1009 and the second semiconductor layer 1011 form a pnp junction due to their respective doping. Similarly, the isolation structure I2 includes the first semiconductor layer 1009, the second semiconductor layer 1011, and the first source/drain layer 1013 of the second element D2. The first semiconductor layer 1009, the second semiconductor layer 1011, and the first source/drain layer 1013 form an npn junction due to their respective doping. The isolation structure I1 and the isolation structure I2 may achieve electrical isolation between the first element D1 and the second element D2. Various semiconductor layers for forming the isolation structure may be formed by epitaxial growth together with the semiconductor layer for defining the active region, so that damage to the crystal structure of the active region can be reduced, and thus deterioration of element performance can be suppressed.

Figure 3:
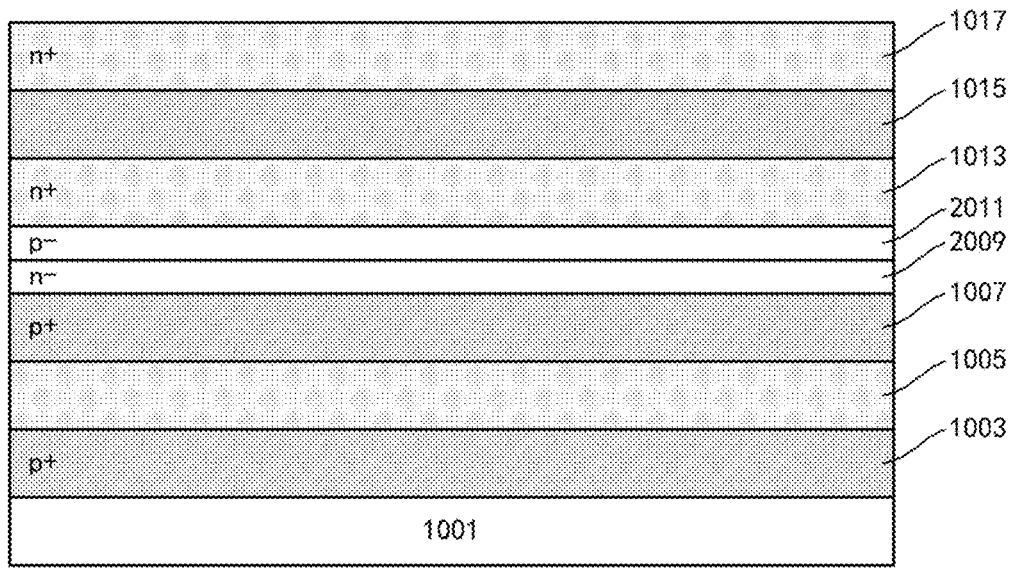
FIG. 3 and FIG. 4 show schematic diagrams of some stages in a process of manufacturing a semiconductor apparatus according to another embodiment of the present disclosure.
Figure 4:
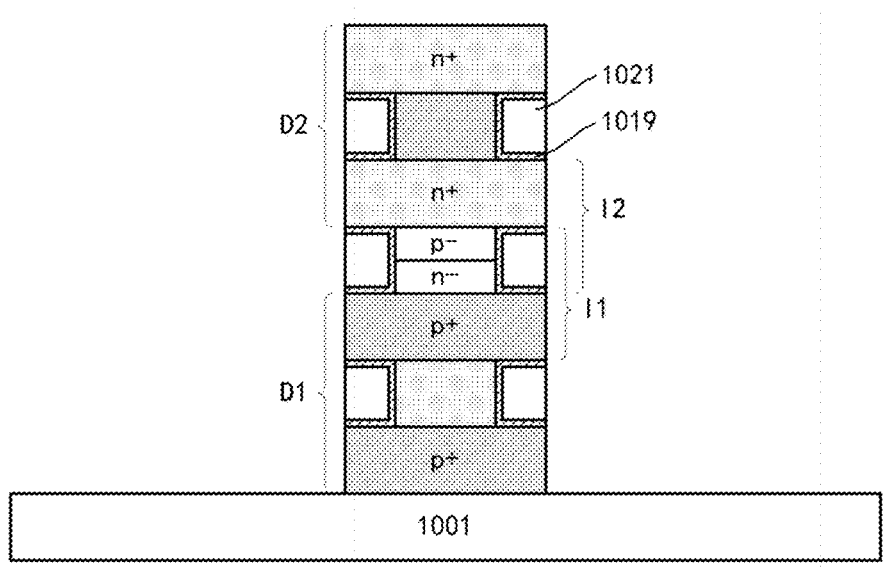

FIG. 3 and FIG. 4 show schematic diagrams of some stages in a process of manufacturing a semiconductor apparatus according to another embodiment of the present disclosure. The embodiment shown in FIG. 3 and FIG. 4 is substantially the same as the embodiment shown in FIG. 1 and FIG. 2, except that the first semiconductor layer 1009 and the second semiconductor layer 1011 are replaced by a third semiconductor layer 2009 and a fourth semiconductor layer 2011, respectively. Hereinafter, the differences between this embodiment and the above-mentioned embodiments will be mainly described, and repeated descriptions will not be presented.

Specifically, in this embodiment, the third semiconductor layer 2009 and the fourth semiconductor layer 2011 may include the same material (e.g. SiGe) as the channel layers 1005 and 1015, and thus they also be recessed laterally so that a gate stack will also be embedded into a recess thereof. The gate stack formed in the corresponding recess which is formed in the third semiconductor layer 2009 and the fourth semiconductor layer 2011 may be the first gate stack for the first element D1, or the second gate stack for the second element D2, or even another gate stack having a different configuration.

In the embodiments described above, the first element D1 and the second element D2 have different conductivity types, and two semiconductor layers with different conductivity types can be disposed therebetween so as to form an npn junction and a pnp junction to achieve electrical isolation. However, the present disclosure is not limited thereto. For example, the first element D1 and the second element D2 may have the same conductivity type.

Figure 5:
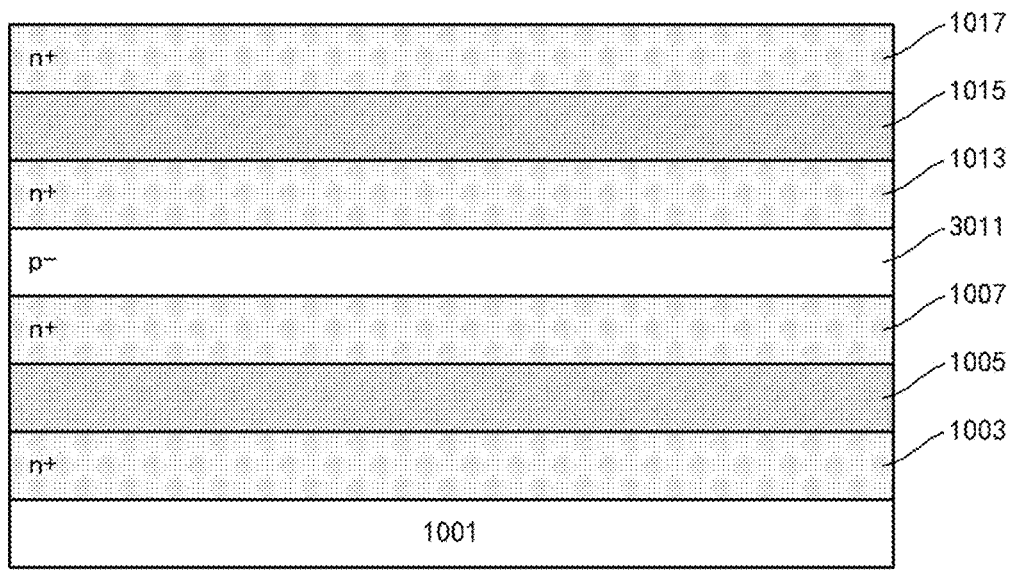
FIG. 5 and FIG. 6 show schematic diagrams of some stages in a process of manufacturing a semiconductor apparatus according to another embodiment of the present disclosure.
Figure 6:
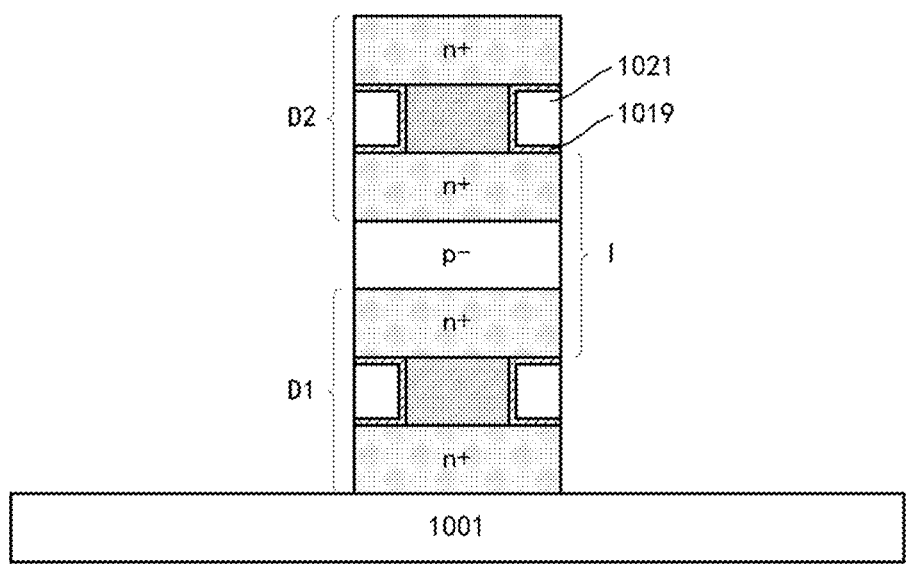

FIG. 5 and FIG. 6 show schematic diagrams of some stages in a process of manufacturing a semiconductor apparatus according to another embodiment of the present disclosure. Hereinafter, the differences between this embodiment and the above-mentioned embodiments will be mainly described, and repeated descriptions will not be presented.

As shown in FIG. 5, a semiconductor layer for defining the active region of the first element D1 and a semiconductor layer for defining the active region of the second element D2 may be provided by, for example, epitaxial growth, on the substrate 1001. Different from the embodiment shown in FIG. 1, in this embodiment, both the first source/drain layer 1003 and the second source/drain layer 1007 of the first element D1 are heavily n-type doped, so that the first element D1 has the same conductivity type as the second element D2.

In addition, a lightly p-type doped fifth semiconductor layer 3011 may be provided between the first element D1 and the second element D2. Similarly, the fifth semiconductor layer 3011 may include Si with a thickness in a range of about 15 nm to 50 nm, and its doping concentration may be less than about $2 \times 10^{19}$ cm$^{-3}$.

As shown in FIG. 6, an active region can be defined and a gate stack can be formed according to the above-mentioned process. In this embodiment, an isolation structure I includes the second source/drain layer 1007 of the first element D1, the fifth semiconductor layer 3011, and the first source/drain layer 1013 of the second element D2. The second source/drain layer 1007, the fifth semiconductor layer 3011 and the first source/drain layer 1013 form an npn junction due to their respective doping. The isolation structure I can achieve electrical isolation between the first element D1 and the second element D2.

In this embodiment, both the first element D1 and the second element D2 are of n-type conductivity, and the isolation structure I includes the npn junction. According to other embodiments, the first element D1 and the second element D2 may have p-type conductivity, and accordingly the isolation structure I may include a pnp junction.

Figure 7:
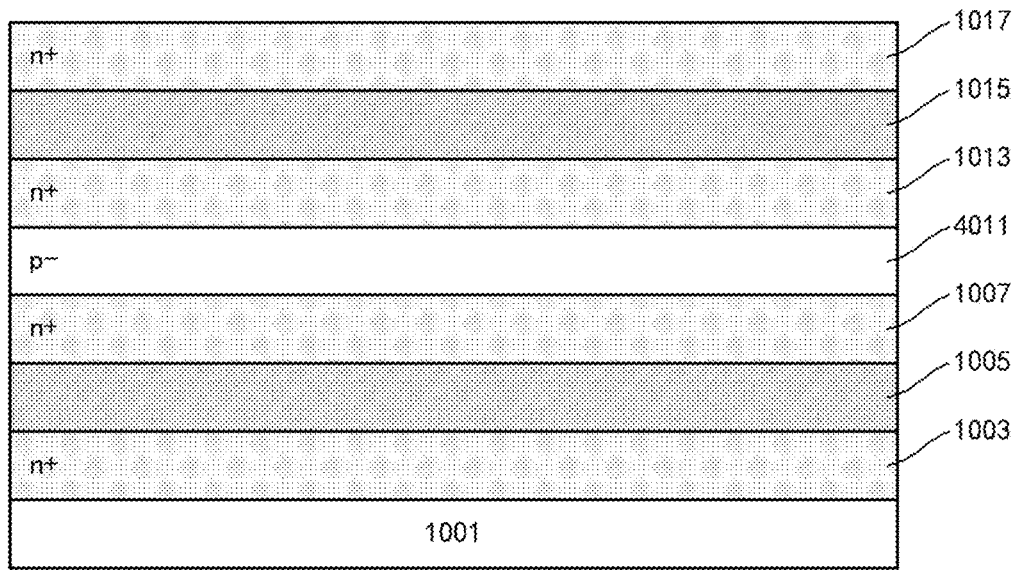
FIG. 7 and FIG. 8 show schematic diagrams of some stages in a process of manufacturing a semiconductor apparatus according to another embodiment of the present disclosure.
Figure 8:
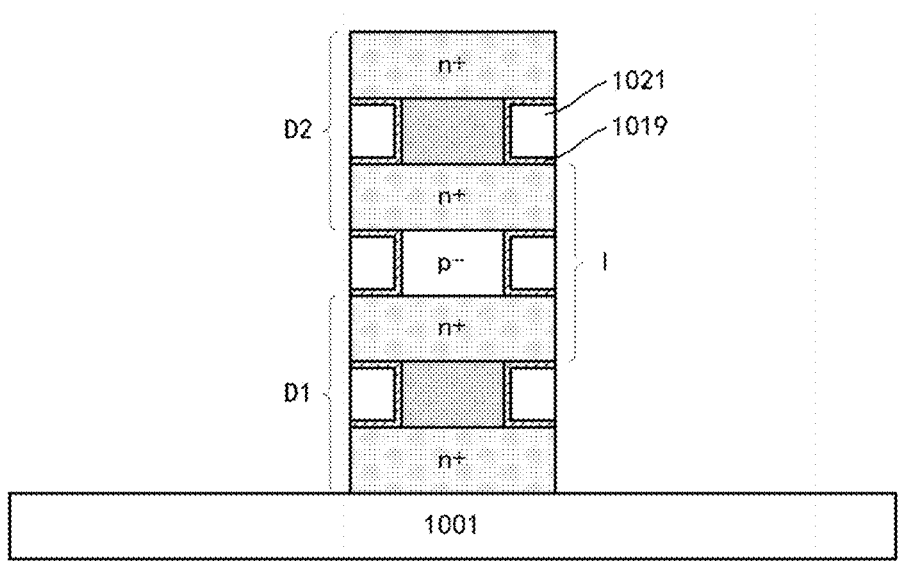

FIG. 7 and FIG. 8 show schematic diagrams of some stages in a process of manufacturing a semiconductor apparatus according to another embodiment of the present disclosure. The embodiment shown in FIG. 7 and FIG. 8 is substantially the same as the embodiment shown in FIG. 5 and FIG. 6, except that the fifth semiconductor layer 3011 is replaced by a sixth semiconductor layer 4011. Hereinafter, the differences between this embodiment and the above-mentioned embodiments will be mainly described, and repeated descriptions will not be presented.

Specifically, in this embodiment, the sixth semiconductor layer 4011 may include the same material (e.g. SiGe) as the channel layers 1005 and 1015, and thus it also be recessed laterally so that a gate stack will also be embedded into a recess. In addition, a doping concentration for the sixth semiconductor layer 4011 can be changed to achieve a higher threshold voltage (the isolation structure I may be equivalent to a vertical element), thereby achieving better electrical isolation.

In the above embodiment, the first element D1 and the second element D2 have the same conductivity type, and a semiconductor layer with an opposite conductivity type may be provided between them, and thus an npn junction or a pnp junction may be formed by the respective source/drain layers of the first element D1 and the second element D2 and the semiconductor layer, so as to achieve electrical isolation. However, the present disclosure is not limited thereto. For example, an npn junction or a pnp junction may be provided directly between the first element D1 and the second element D2.

Figure 9:
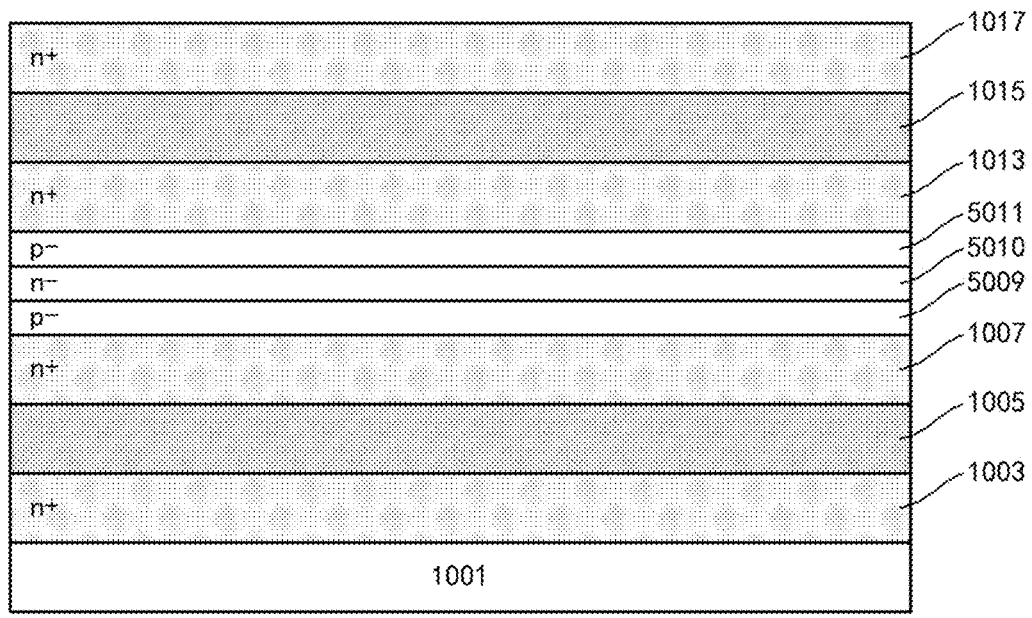
FIG. 9 and FIG. 10 show schematic diagrams of some stages in a process of manufacturing a semiconductor apparatus according to another embodiment of the present disclosure.
Figure 10:
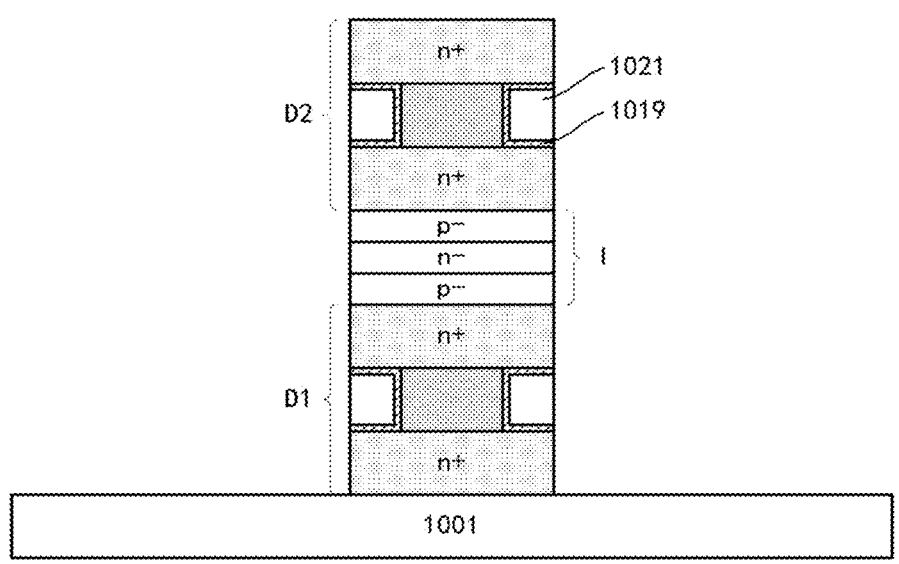

FIG. 9 and FIG. 10 show schematic diagrams of some stages in a process of manufacturing a semiconductor apparatus according to another embodiment of the present disclosure. The embodiment shown in FIG. 9 and FIG. 10 is substantially the same as the embodiment shown in FIG. 5 and FIG. 6, except that the fifth semiconductor layer 3011 is replaced by a seventh semiconductor layer 5009, an eighth semiconductor layer 5010 and a ninth semiconductor layer 5011. Hereinafter, the differences between this embodiment and the above-mentioned embodiments will be mainly described, and repeated descriptions will not be presented.

Specifically, in this embodiment, the seventh semiconductor layer 5009, the eighth semiconductor layers 5010 and the ninth semiconductor layer 5011, which are lightly p-type doped, lightly n-type doped and lightly p-type doped, respectively, may be arranged between the first element D1 and the second element D2, so that the seventh semiconductor layer 5009, the eighth semiconductor layers 5010 and the ninth semiconductor layer 5011 can form a pnp junction. Similarly, the seventh semiconductor layer 5009, the eighth semiconductor layer 5010 and the ninth semiconductor layer 5011 may include Si with a thickness in a range of about 15 nm to 50 nm, and at least one of them may have a doping concentration less than about $2 \times 10^{19}$ cm$^{-3}$. Therefore, in this embodiment, the isolation structure I includes the pnp junction formed by the seventh semiconductor layer 5009, the eighth semiconductor layer 5010 and the ninth semiconductor layer 5011.

According to other embodiments, the first element D1 and the second element D2 may have p-type conductivity, and the isolation structure I may also include a pnp junction.

Figure 11:
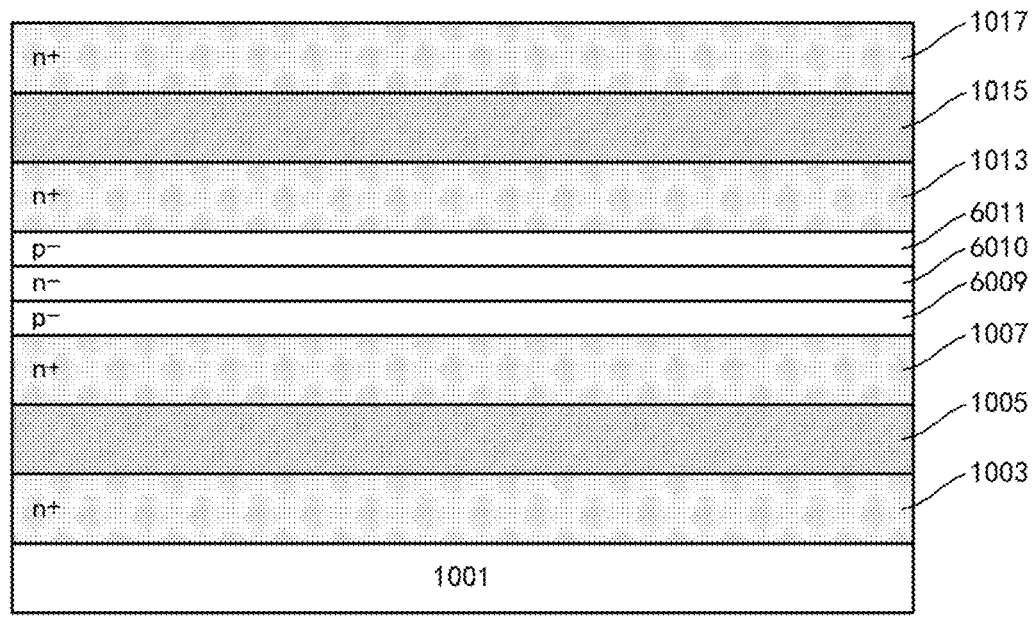
FIG. 11 and FIG. 12 show schematic diagrams of some stages in a process of manufacturing a semiconductor apparatus according to another embodiment of the present disclosure.
Figure 12:
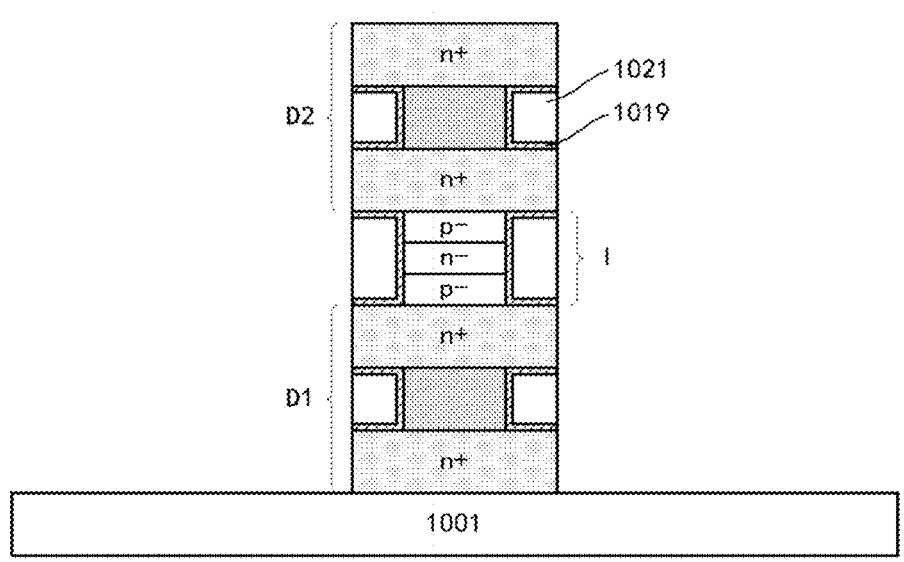

FIG. 11 and FIG. 12 show schematic diagrams of some stages in a process of manufacturing a semiconductor apparatus according to another embodiment of the present disclosure. The embodiment shown in FIG. 11 and FIG. 12 is substantially the same as the embodiment shown in FIG. 9 and FIG. 10, except that the seventh semiconductor layer 5009, the eighth semiconductor layer 5010 and the ninth semiconductor layer 5011 are replaced by a tenth semiconductor layer 6009, a eleventh semiconductor layer 6010 and a twelfth semiconductor layer 6011, respectively. Hereinafter, the differences between this embodiment and the above-mentioned embodiments will be mainly described, and repeated descriptions will not be presented.

Specifically, in this embodiment, the tenth semiconductor layer 6009, the eleventh semiconductor layer 6010 and the twelfth semiconductor layer 6011 may include the same material (e.g. SiGe) as the channel layers 1005 and 1015, and thus they also be recessed laterally so that a gate stack will also be embedded into the recess.

In the above embodiments, the first element D1 and the second element D2 have the same conductivity, and the isolation structure I includes a pnp junction. However, the present disclosure is not limited thereto. For example, an npn junction can also be provided.

Figure 13:
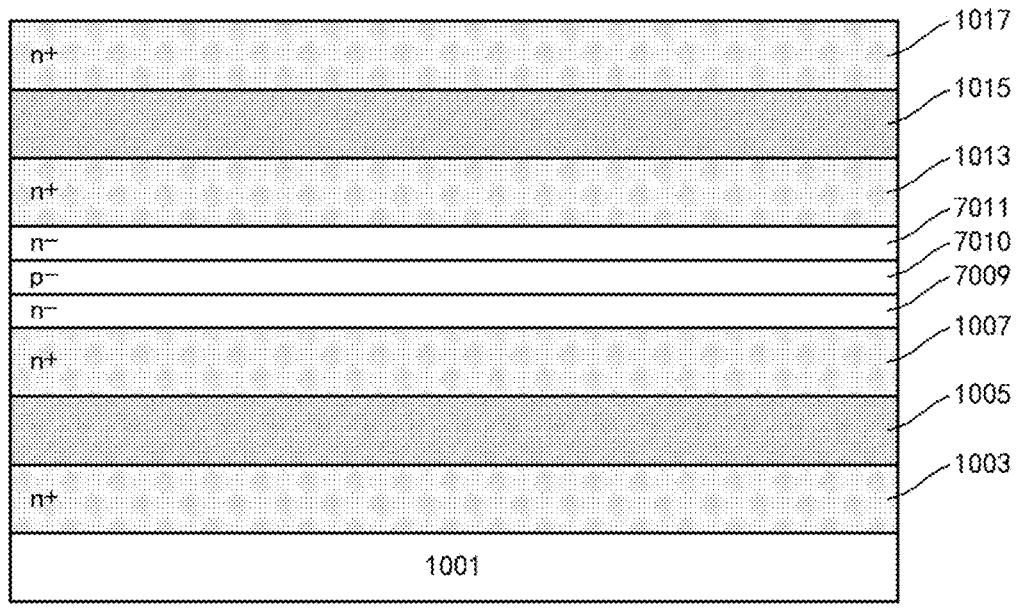
FIG. 13 and FIG. 14 show schematic diagrams of some stages in a process of manufacturing a semiconductor apparatus according to another embodiment of the present disclosure.
Figure 14:
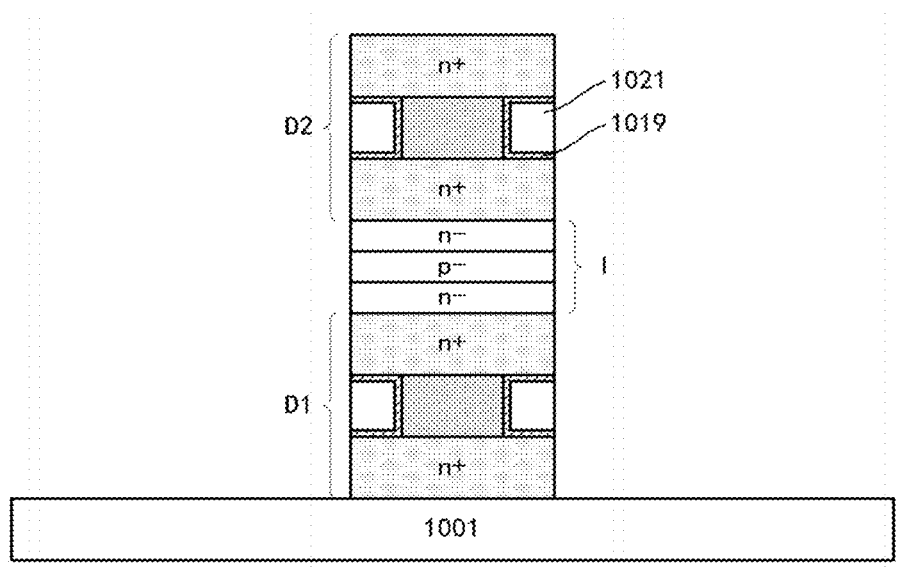

FIG. 13 and FIG. 14 show schematic diagrams of some stages in a process of manufacturing a semiconductor apparatus according to another embodiment of the present disclosure. The embodiment shown in FIG. 13 and FIG. 14 is substantially the same as the embodiment shown in FIG. 9 and FIG. 10, except that the seventh semiconductor layer 5009, the eighth semiconductor layer 5010 and the ninth semiconductor layer 5011 are replaced by a thirteenth semiconductor layer 7009, a fourteenth semiconductor layer 7010 and a fifteenth semiconductor layer 7011, respectively. Hereinafter, the differences between this embodiment and the above-mentioned embodiments will be mainly described, and repeated descriptions will not be presented.

Specifically, in this embodiment, the thirteenth semiconductor layer 7009, the fourteenth semiconductor layer 7010, and the fifteenth semiconductor layer 7011 are lightly n-type doped, lightly p-type doped and lightly n-type doped, respectively (wherein at least one of the thirteenth semiconductor layer 7009, the fourteenth semiconductor layer 7010, or the fifteenth semiconductor layer 7011 may have a doping concentration less than about $2 \times 10^{19}$ cm$^{-3}$), and accordingly the isolation structure I may include an npn junction.

According to other embodiments, the first element D1 and the second element D2 may have p-type conductivity, and the isolation structure I may also include an npn junction.

Figure 15:
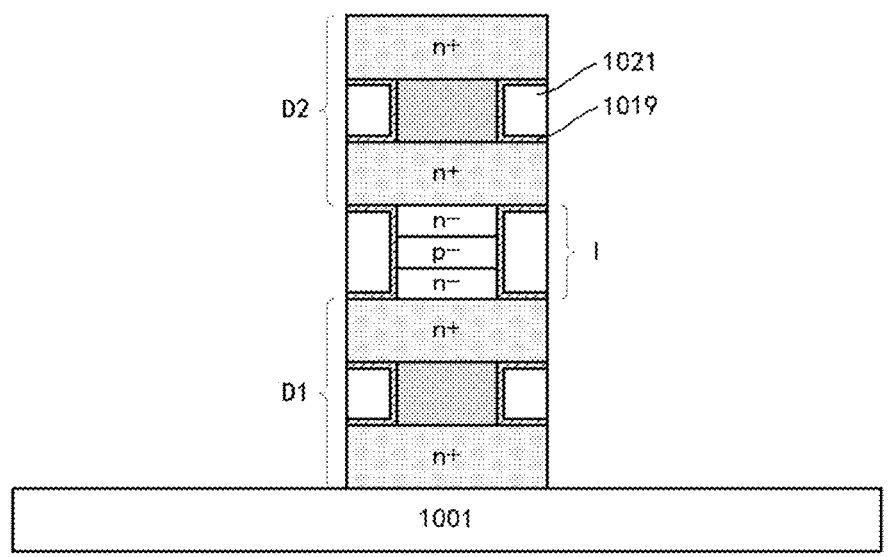
FIG. 15 shows a schematic diagram of a semiconductor apparatus according to another embodiment of the present disclosure.

According to another embodiment, as shown in FIG. 15, the gate stack may also be formed at a periphery of the isolation structure I.

According to the embodiments of the present disclosure, the vertical semiconductor elements stacked on each other may be electrically isolated from each other by the pn junction-based isolation structure between them. The pn junction can be formed in a semiconductor layer. Therefore, the formation of the isolation structure can be compatible with the fabrication of the vertical semiconductor elements.

According to the embodiment of the present disclosure, the semiconductor apparatus can be applied to various electronic devices. For example, an integrated circuit (IC) can be formed based on such semiconductor apparatus, and electronic devices can be constructed therefrom. Accordingly, the present disclosure also provides an electronic device including the semiconductor apparatus described above. The electronic device may also include components such as a display screen cooperating with the IC and a wireless transceiver cooperating with the IC. Such electronic device can be, for example, a smart phone, a personal computer (PC), a tablet computer, an artificial intelligence device, a wearable device, or a mobile power.

According to the embodiment of the present disclosure, a method of fabricating a system-on-chip (SoC) is also provided. The method may include the methods described above. Specifically, a variety of elements can be integrated on a chip, at least some of which are fabricated according to the methods of the present disclosure.

In the above description, technical details such as patterning and etching of various layers are not described in detail. However, those skilled in the art should understand that various technical means can be used to form layers and regions, etc. of desired shapes. In addition, in order to form the same structure, those skilled in the art can also design methods that are not exactly the same as those described above. Additionally, although the various embodiments are described above separately, this does not mean that the measures in the various embodiments cannot be used in combination advantageously.

The embodiments of the present disclosure have been described above. However, these embodiments are for illustrative purposes only, but not intended to limit the scope of the present disclosure. The scope of the present disclosure is defined by the appended claims and their equivalents. Without departing from the scope of the present disclosure, those skilled in the art can make various substitutions and modifications, and these substitutions and modifications should all fall within the scope of the present disclosure.

What is claimed is:

1. A semiconductor apparatus, comprising:
a substrate;
a first vertical semiconductor element and a second vertical semiconductor element stacked on the substrate sequentially, each of the first vertical semiconductor element and the second vertical semiconductor element comprising a first source/drain region, a channel region and a second source/drain region stacked sequentially in a vertical direction; and
a semiconductor layer between the first vertical semiconductor element and the second vertical semiconductor element,
wherein the semiconductor apparatus further comprises a first gate stack at a periphery of the channel region of the first vertical semiconductor element and a second gate stack at a periphery of the channel region of the second vertical semiconductor element, and wherein an upper surface of the first gate stack is substantially aligned with an upper surface of the channel region of the first vertical semiconductor element, a lower surface of the first gate stack is substantially aligned with a lower surface of the channel region of the first vertical semiconductor element, and/or an upper surface of the second gate stack is substantially aligned with an upper surface of the channel region of the second vertical semiconductor element, a lower surface of the second gate stack is substantially aligned with a lower surface of the channel region of the second vertical semiconductor element, and
wherein the semiconductor layer and at least one of the second source/drain region of the first vertical semiconductor element or the first source/drain region of the second vertical semiconductor element form at least one of a pnp junction or an npn junction, so as to form an isolation structure configured to electrically isolate the first vertical semiconductor element from the second vertical semiconductor element.

2. The semiconductor apparatus according to claim 1, wherein in the pn junction, the pnp junction, or the npn junction, at least one of a doping concentration for a p-type doped region or a doping concentration for an n-type doped region is less than $2 \times 10^{19}$ cm$^{-3}$.

3. The semiconductor apparatus according to claim 1, wherein the first source/drain region, the channel region and the second source/drain region of each of the first vertical semiconductor element and the second vertical semiconductor element comprise a single crystal semiconductor material.

4. The semiconductor apparatus according to claim 3, wherein the isolation structure comprises a single crystal semiconductor material.

5. The semiconductor apparatus according to claim 1,
wherein the second source/drain region of the first vertical semiconductor element has a first conductivity type, and the first source/drain region of the second vertical semiconductor element has a second conductivity type;

the semiconductor layer comprises a second conductive-type semiconductor layer and a first conductive-type semiconductor layer disposed between the second source/drain region of the first vertical semiconductor element and the first source/drain region of the second vertical semiconductor element, wherein the isolation structure comprises a first isolation structure and a second isolation structure, the second source/drain region of the first vertical semiconductor element, the second conductive-type semiconductor layer and the first conductive-type semiconductor layer form the first isolation structure, and the first isolation structure comprises one of the pnp junction or the non junction, and the second conductive-type semiconductor layer, the first conductive-type semiconductor layer and the first source/drain region of the second vertical semiconductor element form the second isolation structure, and the second isolation structure comprises the other of the pnp junction or the non junction.

6. The semiconductor apparatus according to claim 5, further comprising:
a third gate stack at a periphery of the second conductive-type semiconductor layer and the first conductive-type semiconductor layer.

7. The semiconductor apparatus according to claim 5, wherein
the second source/drain region of the first vertical semiconductor element and the first source/drain region of the second vertical semiconductor element are heavily doped, and
the second conductive-type semiconductor layer and the first conductive-type semiconductor layer are lightly doped.

8. The semiconductor apparatus according to claim 1, wherein the second source/drain region of the first vertical semiconductor element has a first conductivity type, and the first source/drain region of the second vertical semiconductor element has the first conductivity type;
the semiconductor layer comprises a second conductive-type semiconductor layer disposed between the second source/drain region of the first vertical semiconductor element and the first source/drain region of the second vertical semiconductor element,
wherein the second source/drain region of the first vertical semiconductor element, the second conductive-type semiconductor layer and the first source/drain region of the second vertical semiconductor element form one of the pnp junction or the non junction.

9. The semiconductor apparatus according to claim 8, further comprising:
a third gate stack at a periphery of the second conductive-type semiconductor layer.

10. The semiconductor apparatus according to claim 8, wherein,
the second source/drain region of the first vertical semiconductor element and the first source/drain region of the second vertical semiconductor element are heavily doped, and
the second conductive-type semiconductor layer is lightly doped.

11. The semiconductor apparatus according to claim 1, wherein the second source/drain region of the first vertical semiconductor element has a first conductivity type, and the first source/drain region of the second vertical semiconductor element has the first conductivity type;
the semiconductor layer comprises a second conductive-type semiconductor layer, a first conductive-type semiconductor layer and another second conductive-type semiconductor layer disposed between the second source/drain region of the first vertical semiconductor element and the first source/drain region of the second vertical semiconductor element,
wherein the second conductive-type semiconductor layer, the first conductive-type semiconductor layer and the another second conductive-type semiconductor layer form one of the pnp junction or the non junction.

12. The semiconductor apparatus according to claim 11, further comprising:
a third gate stack at a periphery of the second conductive-type semiconductor layer, the first conductive-type semiconductor layer, and the another second conductive-type semiconductor layer.

13. The semiconductor apparatus according to claim 11, wherein
the second source/drain region of the first vertical semiconductor element and the first source/drain region of the second vertical semiconductor element are heavily doped, and
the second conductive-type semiconductor layer, the first conductive-type semiconductor layer and the another second conductive-type semiconductor layer are lightly doped.

14. The semiconductor apparatus according to claim 1, wherein
the second source/drain region of the first vertical semiconductor element has a first conductivity type, and the first source/drain region of the second vertical semiconductor element has the first conductivity type;
the semiconductor layer comprises a first conductive-type semiconductor layer, a second conductive-type semiconductor layer and another first conductive-type semiconductor layer disposed between the second source/drain region of the first vertical semiconductor element and the first source/drain region of the second vertical semiconductor element,
wherein the first conductive-type semiconductor layer, the second conductive-type semiconductor layer and the another first conductive-type semiconductor layer form one of the pnp junction or the non junction.

15. The semiconductor apparatus according to claim 14, further comprising:
a third gate stack at a periphery of the first conductive-type semiconductor layer, the second conductive-type semiconductor layer, and the another first conductive-type semiconductor layer.

16. The semiconductor apparatus according to claim 14, wherein,
the second source/drain region of the first vertical semiconductor element and the first source/drain region of the second vertical semiconductor element are heavily doped, and
the first conductive-type semiconductor layer, the second conductive-type semiconductor layer, and the another first conductive-type semiconductor layer are lightly doped.

17. An electronic device, comprising the semiconductor apparatus according to claim 1.

18. The electronic device according to claim 17, wherein the electronic device comprises a smart phone, a personal computer, a tablet computer, an artificial intelligence device, a wearable device, or a mobile power.

* * * * *